United States Patent [19]
Uemiya et al.

[11] Patent Number: 5,323,261
[45] Date of Patent: * Jun. 21, 1994

[54] HARMONIC GENERATING DEVICE

[75] Inventors: Takafumi Uemiya; Naota Uenishi; Akira Mizoguchi; Yasuji Ogaki; Yasuhiro Hattori, all of Osaka, Japan

[73] Assignee: Sumitomo Electric Industries, Ltd., Osaka, Japan

[*] Notice: The portion of the term of this patent subsequent to Jul. 7, 2009 has been disclaimed.

[21] Appl. No.: 590,020

[22] Filed: Sep. 28, 1990

[30] Foreign Application Priority Data

Sep. 30, 1989 [JP] Japan .................. 1-256827
Dec. 25, 1989 [JP] Japan .................. 1-149056

[51] Int. Cl.$^5$ ............................. G02B 6/16
[52] U.S. Cl. ...................... 359/326; 359/328; 359/332; 385/123; 428/372; 428/401; 428/378
[58] Field of Search ............. 428/372, 378, 401; 385/122, 123, 124, 141, 142, 143; 359/326, 328, 332

[56] References Cited

U.S. PATENT DOCUMENTS

| 4,159,863 | 7/1979 | Stewart | 385/124 |
| 4,830,447 | 5/1989 | Kamiyama et al. | |
| 4,923,277 | 5/1990 | Okazaki et al. | 385/123 |
| 5,080,462 | 1/1992 | Goto | 385/122 |
| 5,119,458 | 7/1992 | Okamoto et al. | 385/122 |
| 5,129,029 | 7/1992 | Uemiya et al. | 385/122 |

FOREIGN PATENT DOCUMENTS 0315146 5/1989 European Pat. Off. .
2-219032 8/1990 Japan .
4-37731 2/1992 Japan .

OTHER PUBLICATIONS

Fujii et al., "Light Scattering Properties", Optics and Laser Technology, vol. pp. 40-44, Feb. 1984.

Primary Examiner—George F. Lesmes
Assistant Examiner—Christopher Brown
Attorney, Agent, or Firm—Cushman, Darby & Cushman

[57] ABSTRACT

A fiber-type wavelength converting device comprises a nonlinear optical crystal core; and a glass cladding surrounding the core that produces a second harmonic utilizing Cherenkov radiation. An exit end face of the cladding is flat, and an exit end face of the core has asperities. The exit end face of the core is formed inside with respect to the exit end face of the cladding, and particles may be filled in a recess portion composed of a bottom surface of the exit end face of the core and side surface of an inner wall of the cladding. The cladding has an outer diameter of at least 1 mm to prevent breakage of device upon polishing and grinding. A thin film may be formed on an input end face of the device.

8 Claims, 5 Drawing Sheets

HARMONIC GENERATING DEVICE

BACKGROUND OF THE INVENTION

1. Field of the Invention

The present invention relates to a fiber-type wavelength converting device that produces a second harmonic output light generated by Cherenkov radiation. More particularly, the fiber-type device includes a nonlinear optical crystal core and a cylindrical cladding of a glass-like material. The generated second harmonic signal has a high signal-to-noise (S/N) ratio.

2. Description of the Prior Art

Nonlinear optical effects are phenomena wherein light that is incident upon a certain medium produces polarization proportional to quadratic or high terms of the intensity of the electric field of the light. These phenomena cause such events as the generation of second harmonic waves.

Devices having media capable of generating nonlinear optic effects in incident light are called "nonlinear optical devices". Inorganic materials such as $KH_2PO_4$ and $LiNbO_3$ are commercially available as nonlinear optical devices. Recently, much attention has been focused on organic materials, such as 2-methyl-4-nitrileaniline (MNA), due to their high nonlinear optical constants.

Nonlinear optical devices used to generate harmonics are designed as an optical integrated circuit made of a substrate with a lightguide formed thereon through which light propagates. The lightguide is covered with an overlay. In order to "pick up" the second harmonic generated in the lightguide, a waveguide path must be constructed to accommodate the phase velocity of the second harmonic propagating therethrough. That is, the waveguide path must be phase-matched with the second harmonic. The simplest way to do is to use Cherenkov radiation.

The principle of Cherenkov radiation is illustrated in FIG. 1. Light propagating through lightguide 111 generates a second harmonic at point A that is launched into both a substrate 121 and an overly 131 at an angle $\theta$. If the equiphase plane of the generated second harmonic agrees with that of the second harmonic that is generated in the direction of angle $\theta$ at point B after a period of time, then a second harmonic is launched at point C in the direction of angle $\theta$. Phase matching is automatically attained when the following condition is satisfied:

$$n_s(2\omega) > n_G(\omega) > n_s(\omega)$$

where $n_s(\omega)$ is the refractive index of the substrate with respect to the fundamental wave, $n_G(\omega)$ is the effective refractive index of the lightguide with respect to the fundamental wave, and $n_s(2\omega)$ is the refractive index of the substrate with respect to the second harmonic wave.

It is further known that the Cherenkov radiation can be realized not only by a harmonic generating device in an optical integrated circuit, but also by an axially symmetric fiber-type wavelength converting device, the core of which is made of an organic material having a large nonlinear optical constant.

Depicted in FIG. 2 is a fiber-type wavelength converting device 9 including a core 10 constructed of an organic nonlinear optical crystal with a second-order nonlinear optical effect and a cladding 11 typically made of glass. Cladding 11 does not have any second-order nonlinear optical properties. In order to launch a second harmonic from the core into the cladding as shown by arrow 12, the following condition need be satisfied;

$$n_{cl}(2\omega) > n_{co}(\omega) > n_{cl}(\omega)$$

where $n_{cl}(2\omega)$ is the refractive index of cladding 11 with respect to the second harmonic, $n_{co}(\omega)$ is the refractive index of the core 10 with respect to the fundamental wave L1, and $n_{cl}(\omega)$ is the refractive index of the cladding 11 with respect to the fundamental wave L1.

Since the second harmonic that is generated is launched from cladding 11 at a given divergence angle, the second harmonic beam emerging from end 9a of fiber-type device 9 produces an annular pattern as shown by 14. The fundamental wave is launched from the core at a small angle of divergence and produces a circular pattern indicated by 13.

The fiber-type device 9 is formed into a desired length by cutting the cladding and the core using a fiber cutter. However, the end face 9a is usually not cut flat as shown in FIGS. 3(a), 3(b) and 3(c). Hence, the emerging second harmonic wave is distorted.

In order to rectify this problem, it is possible for one to attempt to grind and polish the cut end surface 9a. However, in the current state of the art, the outside diameter of cladding 11 can not be greater than 300–500 μm. Due to insufficient strength, many of the fine fibers will be broken during grinding and polishing, thereby decreasing the fiber yield.

An alternative to the polishing and grinding process is to fix fiber 9 within a ferrule using an adhesive and to grind and polish fiber 9 before cutting. If the entrance end face of the fiber is ground and polished, the nonlinear optical crystal core will collapse, thereby making admission of laser light, the usual source of the fundamental wave, impossible. Thus, the exit end face must be ground and polished with the entrance end being cut. This approach has been problematic since it has been difficult to cut the fiber to a desired length of about several millimeters with the fiber device being fixed within the ferrule.

It is also known in the art to use the fibers described above in an apparatus developed so as to be capable to reading information from pits on an optical disk. FIG. 4 illustrates a typical arrangement for such a use. A light beam issues from semiconductor laser 81 and is focused to a point by passing through collimator lens 82 and focusing lens 83. The light beam is focused to a point on a fiber-type wavelength converting device 84. At the exit end of device 84, the fundamental wave emerges from the core while the second harmonic emerges from the cladding. The apparatus under consideration utilizes the second harmonic that emerges from the cladding. The second harmonic, which issues at a predetermined angle of divergence, passes through conical prism 85 so that the entire second harmonic is collimated. The collimated beams pass through a polarizing beam splitter 86 and the optical path of the beams is then bent by mirror 87. The beams then pass through quarterwave plate 88 and focusing lens 89 focuses the beams to be incident on optical disk 90.

Light that is reflected from a pit on disk 90 is again collimated by focusing lens 89. The reflected light passes through quarter waveplate 88 and is reflected by mirror 87. The reflected beams optical paths are further bent by polarizing beam splitter 86. Lens 91 focuses the beam so as to have it incident an photodetector 92.

Although the fundamental wave issuing from the exit end of the core of fiber-type wavelength converting device 84 is also incident on conical prism 85, the fundamental wave is not collimated by prism 85 as prism 85 is designed so as to collimate only the wavefronts of the second harmonic as these form through a given angle of divergence. Even if the fundamental wave passes through polarizing beam splitter 86, mirror 87, quarter waveplate 88 and focusing lens 89, it is not focused to a point on disk 90. Rather, the fundamental wave will illuminate a certain measurable area on disk 90 indicated by dashed line 93 in FIG. 4. The fundamental wave reflected from disk 90 is focused by lens 91 and directed into photodetector 92 like the second harmonic.

In order to increase the S/N ratio of the signal detected by photodetector 92 in the above-described apparatus, it is desirable to improve the intensity ratio of the second harmonic to the fundamental wave detected by photodetector 92. To do this, it has been common to insert wavelength filter along the optical path. However, to select the second harmonic by sole use of wavelength filters, a plurality of filters need be superposed on one another and the intensity of the inherently weak second harmonic is further reduced. Further, extra space is required for such wavelength filters.

Noting that the S/N ratio of the signal detected at photodetector 92 is approximately equal to the ratio of the intensity of the second harmonic to the fundamental at pits of disk 90, it is clear that to improve the S/N ratio at detector 92, it is theoretically possible to increase the intensity of the second harmonic at pits on disk 90, and to decrease the intensity of the fundamental over the area defined by dashed line 93. However, this is much more difficult to accomplish in practice than in theory.

The ratio of the second harmonic exiting fiber-type device 84 to the power of semiconductor laser 81 ("percent conversion to harmonic") is determined by the construction of fiber-type device 84. The light that emerges therefrom is condensed by conical prism 85, thus the quantity of the second harmonic on the surface of the optical disk 90 will be constant if a spot smaller in diameter than each pit on the disk is produced. Accordingly, one practical way to enhance the S/N ratio of the signal detected by photodetector 92 is to lower the illumination intensity of the fundamental wave of the surface of disk 90.

In order to lower the illumination intensity of the fundamental wave on the surface of the optical disk 90, it is advantageous to ensure that the angle of divergence of the fundamental beam emerging from fiber-type device 84 is increased as much as possible, thereby diffusing the beam as much as possible. It is possible to increase the angle of divergence by providing a greater difference in refractive index between the core and the cladding with respect to the fundamental wave. However, the fundamental wave is spherical and always contains a beam that emanates at a angle of divergence coincident with that of the second harmonic. Since this beam has coherent wavefronts, it is converged to twice as large spot as is the second harmonic wave before returning to the photodetector. This makes it impossible to achieve a significant improvement in the S/N ratio.

Further, in the above fiber-type device 84, the organic nonlinear optical crystal of the core 10 sublimates or changes its quality at the end of the device at which the optical crystal contacts an ambient gas such as air. Thus, the device has such disadvantages that wavelength conversion efficiency and input coupling efficiency of the fundamental wave are remarkably decreased and its optical loss increases, as a time lapses.

In order to solve the problems, Japanese patent application laid-open Nos. 79032/1990 and 79033/1990 disclose a method in which a thin film is formed on both ends of a fiber by a spin coat method etc. However, in case that the thin film is formed on the exit end face by the method, it is difficult to make the film thickness uniform. Accordingly, the method has a problem that aberration occurs on the wavefront of the second harmonic.

SUMMARY OF THE INVENTION

It is therefore an object of the present invention to provide a fiber-type wavelength converting device which produces a comparatively high intensity of second harmonic.

It is another object of the present invention to provide a fiber-type wavelength converting device in which an organic nonlinear optical crystal of a core does not sublimate or change its quality.

It is still another object of the present invention to provide a fiber-type wavelength converting device which is not easily bent at grinding so that the yield of the device is increased.

In the fiber-type wavelength converting device of the present invention, the exit end face of the cladding is flat, while the exit end face of the core is roughened. Since the exit end face of the core is roughened, the angle of divergence of the fundamental wave is substantially increased and the wave fronts thereof are sufficiently disturbed to ensure that the second harmonic is detected with a comparatively high intensity. Since the exit end face of the cladding is flat, the angle of divergence of the second harmonic is kept about the same as in the prior art and the wavefronts thereof are aligned.

BRIEF DESCRIPTION OF THE DRAWINGS

Other objects, features and characteristics of the present invention, as well as the methods of operation and the functions of the related elements, and to the combination of parts and economies of manufacture, will become apparent upon consideration of the following description and the appended claims with reference to the drawings in which:

DETAILED DESCRIPTION OF THE INVENTION

As described above, the present invention comprises a core of an organic material and a cladding of a glass-like material. The organic nonlinear optical crystal that can be used in the present invention is not limited in any way, and various organic nonlinear optical materials may be used. These materials include: 3-nitro-5-(N, N-dimethylamino)-acetanilide, 3(N, N-dimethylamino)-aniline, N-(4',-methoxybenzoyl)-4-cyanoaniline, N-methyl-N-(4-cyanophenyl) aminoacetonitrile, N-(4-cyanophenyl)aminoacetonitrile, 4-nitrobenzylidene-2, 3-dimethylaniline, 4-nitrobenzylidene-2, 4-dimethylaniline, 4-nitrobenzylidene-2, 5-dimethylaniline, 4-nitrobenzylidene-3, 4-dimethoxyaniline,4-nitrobenzylidene-3,4,5-trimehoxyaniline, 3-nitrobenzylidene-3,4,5-trimethoxyaniline, 2-nitrobenzylidene-3,4,5-trimethoxyaniline, 3-nitrobenzylidene-2,3-dimethylaniline, 3-nitrobenzylidene-2,5-dimethylaniline, 3-nitrobenzylidene-3, 5-dimethyaniline, 2-methyl-4-nitroaniline (MNA), 4-(N, N-dimethylamino) -3-acetamidonitrobenzene (DAN), 4,5-dimethyl-1, 3-dithiol-2-ylidenecyanoacetate, 1,3-dithiol-2-ylidenecyanoacetate, N-(4-nitropheny61)-(S)-prolinol (NPP), N-(5-nitro-2-pyridyl)-(S)-phenylaralinol (NPPA), and 9-methyl-carbazole -3-carboxaldehyde, etc. The cladding is formed of a conventional glass material such as SF4.

Figure 1:
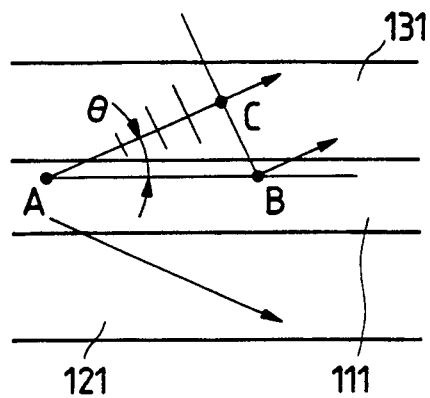
FIG. 1 illustrates the principle of Cherenkov radiation.
Figure 2:
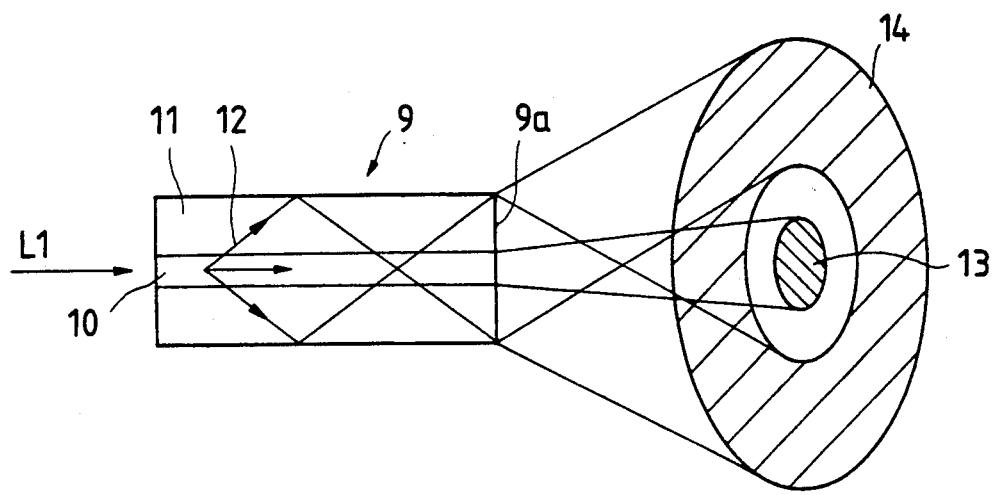
FIG. 2 depicts the output pattern of light from a fiber-type wavelength converting device.
Figure 3A:
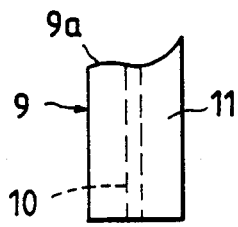
FIGS. 3(a) to 3(c) show prior examples of conventional fiber-type devices with cut end faces.
Figure 3B:
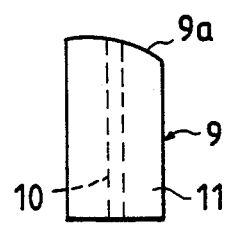
Figure 3C:
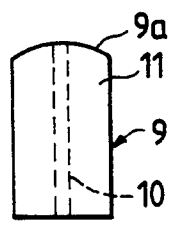
Figure 4:
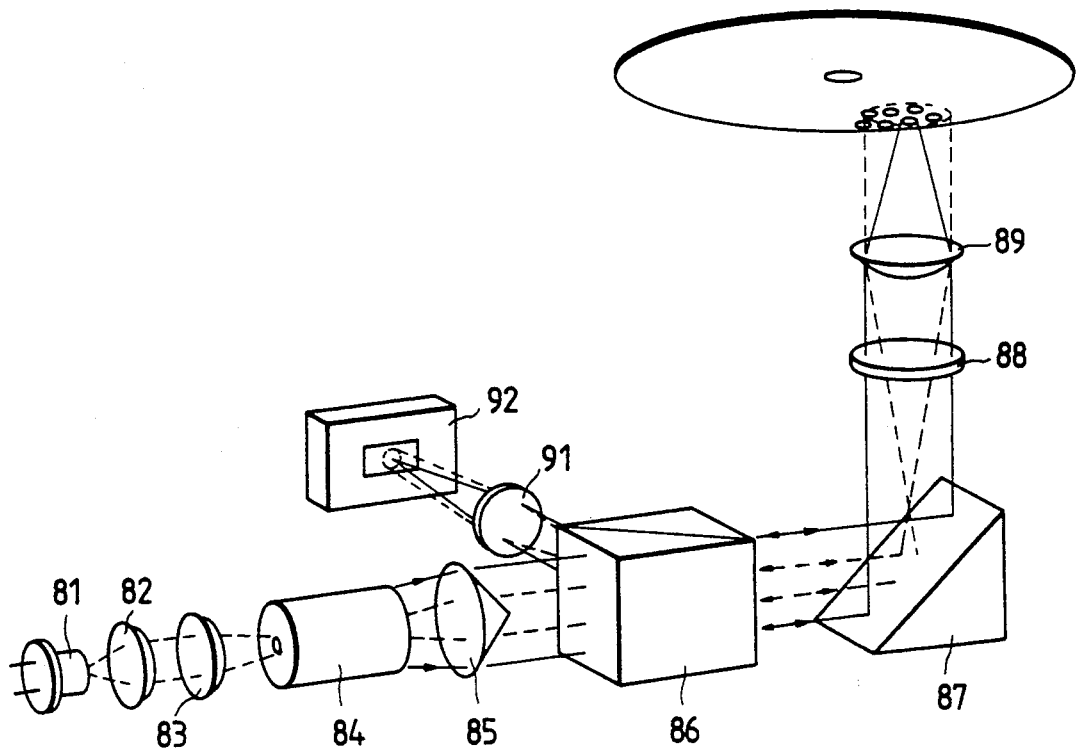
FIG. 4 is a perspective view of an apparatus for reading information from pits on an optical disk using a fiber-type device.
Figure 5:
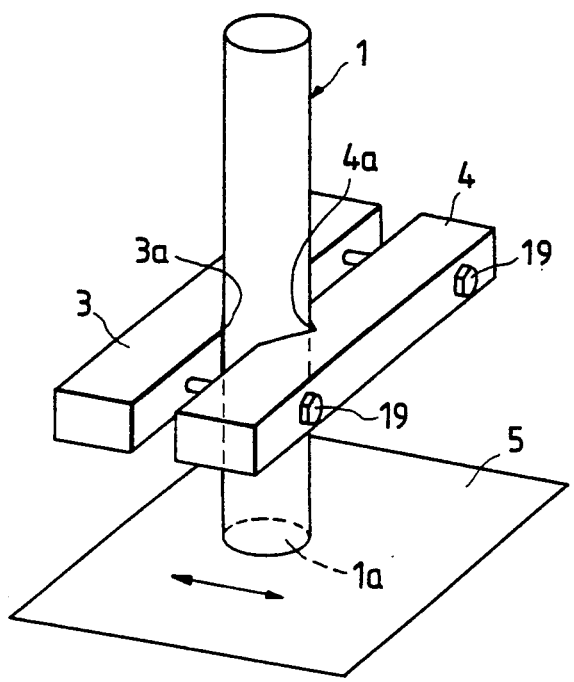
FIG. 5 is a perspective view illustrating the fiber-type device according to the present invention as placed in a vertical position for grinding and polishing.

FIG. 5 depicts a perspective view of fiber-type wavelength converting device 1 according to the present invention placed in a vertical position for grinding and polishing operations. Device 1 is held between grooves 3a and 4a in a pair of holding members 3 and 4. Holding members 3 and 4 are held together by a pair of screws 19 so that an end face 1a may be polished with a sheet of grinding paper 5.

Figure 6:
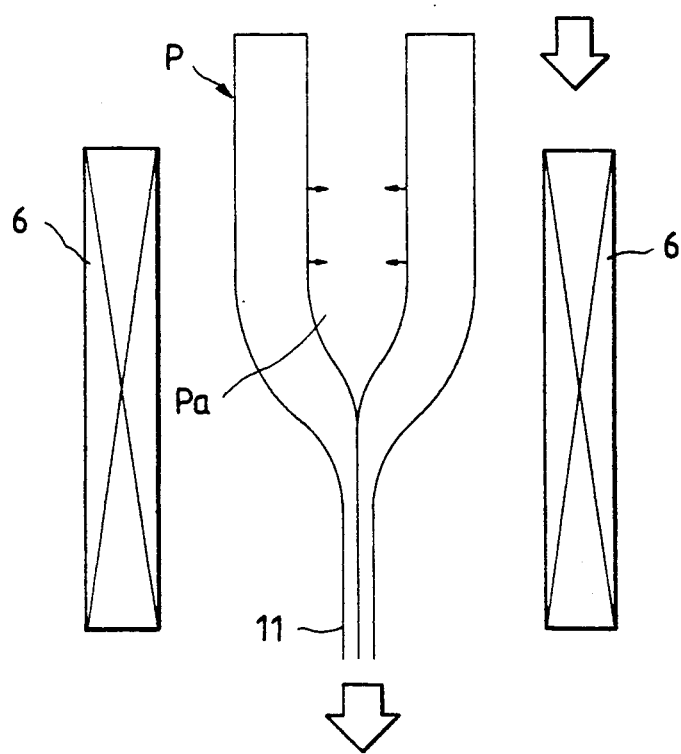
FIG. 6 schematically depicts the process for producing the cladding of the fiber-type device according to the present invention.

FIG. 6 illustrates schematically the process for producing the cladding 11 for fiber-type device 1 (FIG. 5). Glass preform P having a predetermined outside diameter and bore size is fed at a predetermined speed and drawn into a wire as it is melted by heating with surrounding heater 6. Hence, the outside diameter of the preform is reduced to a value in the range from one to several millimeters and a bore size of only a few microns.

Figure 7:
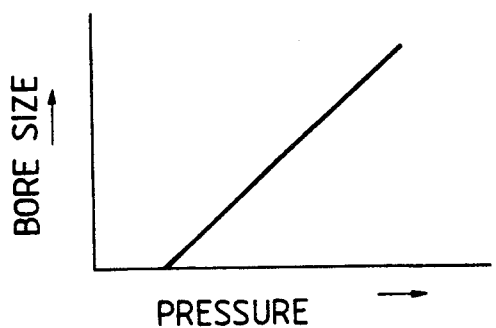
FIG. 7 graphically illustrates the relationship between the pressure applied into the hole in a glass preform and the bore size of the hole.

The outside diameter of cladding 11 can be increased by reducing the speed at which glass preform P is drawn into a wire. The bore size of cladding 11 can be controlled by adjusting the speed at which the glass preform P is fed and the pressure applied towards the bore Pa of preform P. More specifically, the inside diameter of glass preform P in a molten state decreases due to surface tension. Therefore, bore size of cladding 11 is reduced by increasing the heating time as well as the feeding speed. Glass preform P is fed at a slower speed than is an ordinary quartz optical fiber to achieve the reduced bore size. The pressure applied towards preform bore Pa helps prevent bore Pa from being totally closed and permits the bore size to be controlled so as to make it a desired value. It has been shown, as illustrated in FIG. 7 that the bore size is linearly proportional to the pressure applied. In other words, the bore size is controllable by adjusting the pressure applied to the plenum.

There are two methods of forming an organic nonlinear optical crystal of the core 10 in the cladding 11 formed by the above described method. One is a melt liquid method in which a melt liquid of the above crystal is filled into the cladding 11 by capillary phenomenon and the like, temporarily crystallized by cooling, melted again, and then cooled from one end to the other end sequentially, so that the single crystal is grown in the cladding 11. The other is a solution method in which a seed crystal is attached to one end of the cladding 11, a solution including an organic crystal material is filled in the cladding 11 and heated, and the cladding 11 is sequentially cooled from one end to the other end, so that the single crystal is grown from the seed crystal.

According to the above-described method, cladding 11 is produced to have an outer diameter of at least 1 mm. An optical fiber using the cladding 11 would be able to withstand grinding and polishing of an end. The polished end face enables an undistorted second harmonic to exit the device.

Even if the end face sags slightly toward the periphery of cladding 11, because the cladding has such a large outside diameter ($\geq 1$ mm) that the second harmonic does not pass through the sagging portion. Instead, an annular output is produced in the absence of any incoherence in phase relationship of wavefronts.

Figure 8:
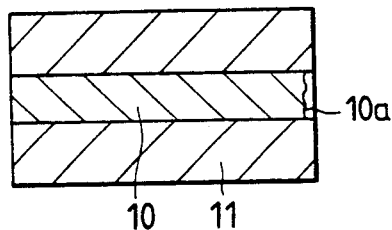
FIGS. 8 to 11 are cross sectional views of four examples of the fiber-type device according to the present invention.
Figure 9:
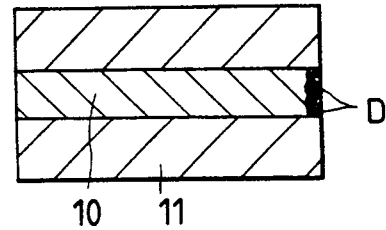

The core of the present invention is made of a relatively brittle material compared. Core 10, as illustrated in FIGS. 8 and 9, is made of an organic nonlinear optical crystal, as described above, surrounded by cladding 11. Core 10 is ground and polished at its exit end 10a, thereby producing fine asperities at end 10a as shown in FIG. 8. It is also possible for particles D to collect exit end 10a as shown in FIG. 9. Hence, the fundamental wave that propagates through core 10 is scattered at end 10a so as to emerge therefrom with a large angle of divergence. Also, due to the asperities and/or particles D, the emerging wavefronts are disturbed. However, the exit face of cladding 11 is ground and polished so as to be smooth thereby allowing the second harmonic to emanate with coherent wavefronts.

Further, due to the particles, the organic nonlinear optical crystal of the core does not contact the ambient gas such as air at the exit end face of the core, so that the core does not sublimate or change its quality at the exit end face.

Figure 10:
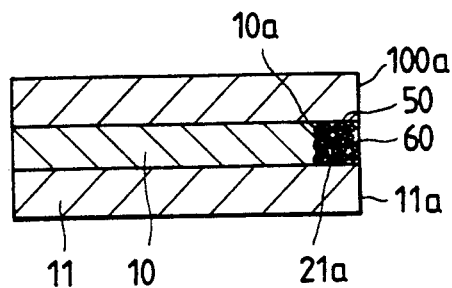

FIG. 10 is a sectional view showing a fiber-type wavelength converting device according to another embodiment of the present invention. This fiber-type device is formed by cutting a fiber, and grinding the cut surface using a grinding agent such as oxide aluminum powder as described above, so as to form the exit end face 100a. In the grinding, the crystal of the core 10 which is softer than that of the cladding 11, is more deeply grinded than the cladding 11, so that a recess portion 50 composed of the bottom surface of the exit end face 10a of the core 10 and the side wall of the cladding inner wall 21a is formed. At the same time, asperities are formed on the end face 10a of the core 10. Particles 60 of the grinding particles such as oxide aluminum powder or grinded pieces are filled in the recess portion In the fiber-type device, the exit end face 100a is grinded, so that the exit end face 11a of the cladding 11 is made flat.

When the exit end face is ground by a grinding material composed of a high molecular film with the grinding particles, the high molecular material constituting the film as well as the particles 60 is filled in the recess portion 50, so that the recess portion 50 are more tightly filled.

Figure 11:
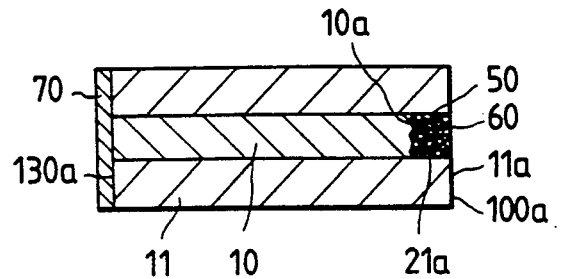

The fiber-type device may be provided with a thin film 70 by a spin coat method or the like as shown in FIG. 11. In this case, by the particles 60 filled in the recess portion 50 and the thin film 70, the organic non-linear optical crystal of the core 10 does not contact the ambient gas such as air at both the end faces, so that sublimation and deterioration of the core 10 can be absolutely prevented.

The material formed into the thin film 70 is required to be transparent for visible and near infrared light, and is preferably a dielectric material. For example, inorganic materials such as $SiO_2$, $MgF_2$, $Al_2O_3$, $Si_4N_3$, $LiNbO_3$ and ZnO, and organic materials such as polyethylene, polymethyl methacrylate, polyacrylic acid are exemplified. In view of transmissibility of the core, the inorganic materials are more preferable.

When the thin film 70 is formed o the input end face 130a of the fiber-type device including the core of an organic nonlinear optical crystal, which easily sublimates, such as PRA, the thin film 70 may be formed by coating a solution including the thin film material and the organic nonlinear optical material constituting the core on the input end face 130a. However, in order to increase the coupling efficiency of the fundamental wave without deteriorating the core 10 before or after the formation of the thin film 70, the thin film 70 is preferably formed by coating a solution including the organic nonlinear optical material of the core 10 and the thin film material dispersed into the solution using surface-active agent to the input end face 130a, and drying and solidifying it. If the thin film 70 is formed by this method, problems do not occur that the organic nonlinear optical crystal of the core 10 is dissolved at the thin film formation, or the crystal of the organic nonlinear material is deposited at the input end face of the core 10.

Further, when the thin film 70 is formed on the input end face 130a of the fiber-type device having the core of the organic nonlinear optical crystal such as DAN which does not easily sublimate but deteriorates by moisture in the air, the thin film 70 made of $SiO_2$, $MgF_2$, $Si_4N_3$ is preferably formed by vacuum evaporation, cluster-ion beam, electron synchrotron resonance method and the like under a reduced pressure.

By precisely controlling the thickness of the thin film of the inorganic dielectric material, the thin film can be formed into a reduced reflecting film. The reduced reflecting film is defined by satisfying the following equation:

$$nd = (\frac{1}{2} + m/2)\lambda$$

where m is an integer more than 0, n is a refractive index of the film, d is a film thickness, and λ is a wavelength. When the thin film satisfies the following equation:

$$n = \sqrt{ns}$$

where n is the refractive index of the film, and ns is a refractive index of a crystal of the organic nonlinear optical material of the core, the reflectivity of the second harmonic becomes 0.

A high refractive index layer of $MgF_2$ and the like may be formed on the thin film as the reduced reflecting film.

EXAMPLE

Examples of the above-described invention are described below with reference to FIGS. 12 and 13.

EXAMPLE 1

A fiber-type device is constructed utilizing the following method. 4-dimethylamino-3-acetamido-nitrobenzene was chosen as the material of the nonlinear optical crystal. The crystal material was melted and allowed to ascend via capillary action up a tube with an inner diameter of 2.5 μm and an outer diameter of 1.4 mm. The tube was made of SF4 glass (lead glass) having a refractive index of 1.75. The melt was then subjected to crystal growth.

The tube enclosing the grown organic nonlinear optical crystal was then nicked in the middle with a file and broken into the length of 2.4 mm. The section was ground and polished at an end face using a lapping film sheet comprised of aluminum oxide particles having a diameter 0.3 μm. Thus, the fiber-type wavelength converting/harmonic generating device having the exit end face of the ground end face was prepared.

The ground end face of the fiber-type device was observed through electron micrography. As a result, it was found that the exit end face of the core was located inside as compared with the exit end face of the cladding, and the exit end face of the core had asperities. Further, particles of aluminum oxide were attached to the asperities of the exit end face.

EXAMPLE 2

The fiber-type device obtained in example 1 was immersed in a fluorine based solution (Daikin Co., Ltd. trade name "daiflon") and cleaned by an ultrasonic cleaner in order to remove the particles attached to the asperities of the exit end face of the core.

After cleaning, the exit end face of the core was observed. As a result, it was confirmed that the particles of aluminum oxide attached to the asperities were absolutely removed.

COMPARATIVE EXAMPLE 1

The fiber obtained in example 1 was nicked in the middle with a file and break into the length of 2.4 mm. The fiber-type device was prepared without grounding and polishing.

Figure 12:
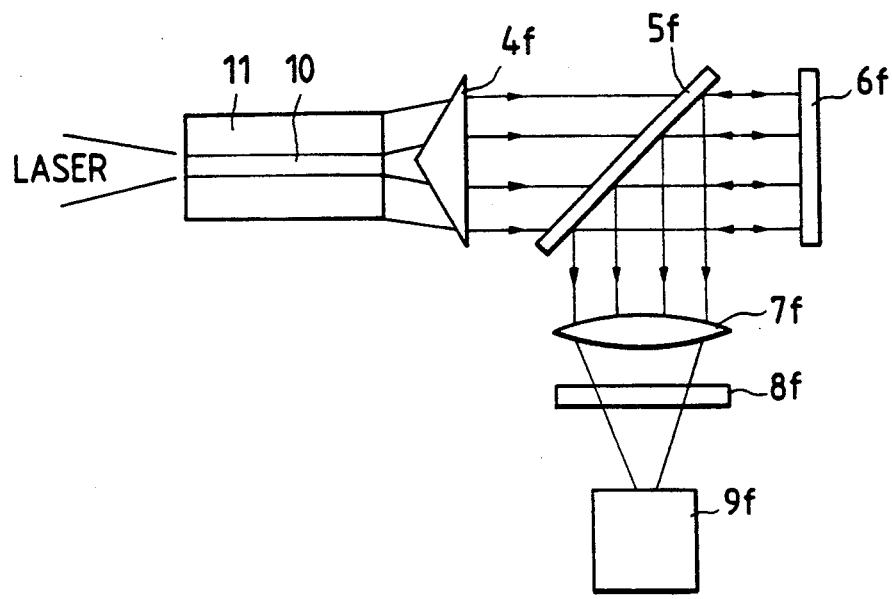
FIG. 12 illustrates a schematic of an apparatus used to test the performance of the harmonic generating devices.
Figure 13:
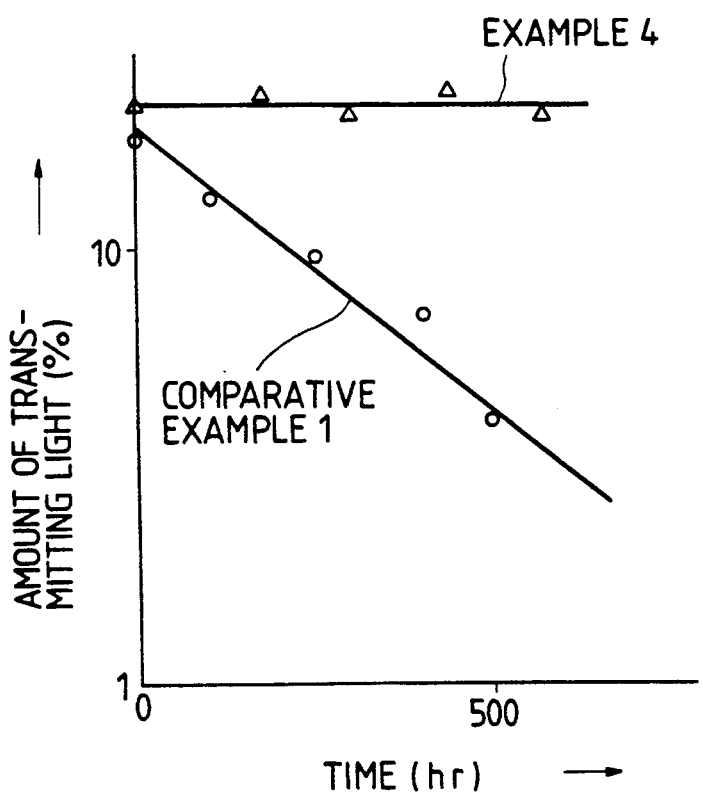
FIG. 13 is a graph showing the relation between a time and an amount of transmitting light in fiber-type devices of example 4 and comparative example 1.

Using the three examples produced, experiments were run using the equipment of FIG. 12. Light from a Q-switched $Nd^{3+}$:YAG laser (wavelength 1.06 μm) was condensed and directed into core 10 of fiber-type device. The second harmonic that emerged from glass cladding 11 was collimated by passing through conical prism 4f. The collimated second harmonic then passed through beam splitter 5f and was reflected by mirror 6f. The light reflected by mirror 6f was bent 90° by beam splitter 5f and converged by condenser lens 7f. To measure the amount of the fundamental wave component of the second harmonic, a fundamental transmitting mirror 8f was provided. Photodetector 9f detected the transmitted fundamental wave.

To obtain parallel light beams of the second harmonic, it was necessary to adjust the apex angle of the conical prism 4f to about 120° as the angle of divergence of the second harmonic emanating from the fiber-type device is 20.6°. Upon measuring the light intensity of the fundamental wave in the second harmonic with photodetector 9f, the result of the examples 1 and 2 came out 5–10 dB lower than the result of the comparative example 1. Measurement of the spot diameter of the second harmonic beam in the absence of mirror 8f turned out being almost equal to the diffraction limit.

EXAMPLE 3

A single crystal of PRA was made in a cladding of SF4 with an inner diameter 1 μm and an outer diameter 1.4 mm formed by the same way as in the example 1 by the melt liquid method, so that a fiber was prepared. One end thereof was cut and the cut surface was ground by imperial lapping films (Sumitomo 3M Co., Ltd. trade mark) with average particle size of 12, 5, 3, and 1 μm in the order, so that the fiber-type device having the exit end face of the ground end face was obtained.

The exit end face was observed through electron micrograph. As a result, it was found that a recess portion with a bottom surface of the exit end face of the core and side surfaces of the cladding inner wall was formed, and the ground pieces of glass or polymer constituting the film were filled in the recess portion.

PRA powder was excessively added in a solution (solid material 25 wt %) formed by dispersing polyacrylic acid by surface-active agent, which was agitated for 30 minutes at a room temperature so as to dissolve the powder. The unground end face of the fiber-type device described above was cut, and the above solution was coated on the cut surface by a spin coat method (4000 rpm×10 seconds), dried and solidified, so that a high molecular film made of acrylic based high molecular material was formed. When the end face on which the high molecular film was formed, was inspected by an optical microscope, it was found that the single crystal of PRA of the core was not dissolved and kept a mirror surface.

As in example 1, a concentrated optical spot image of the fiber-type device was observed. As a result, it was confirmed that the second harmonic was concentrated till the diffraction limit. Further, after one month lapsed, the end face of the PRA single crystal of the core was inspected. As a result, it was confirmed that the input end face and the exit end face did not sublimate.

When the above process was not conducted to the input end face and the exit end face, the core of 20–50 μm length disappeared after a month.

EXAMPLE 4

In order to form a thin film of $MgF_2$ on the input end face of the fiber-type device obtained in example 1, the fiber-type device was disposed in a vacuum chamber for a cluster ion beam (ICB) apparatus. After the vacuum chamber was exhausted to $10^{-6}$ torr, a crucible including $MgF_2$ was heated to 1050° C., and ion cluster was generated under the ion current of 29.5A and acceleration voltage of 2 kV. A shutter was opened so as to form a thin film of $MgF_2$ on the input end face of the fiber-type device at the rate of 15 Å/sec. The thickness was 1900 Å at which reflectivity for the wavelength of 1.06 μm was minimum.

The amount of transmitting light of YAG laser of 1.06 μm for the fiber-type device was larger by 1% than that of the device in which the thin film was not formed.

Also, time change of the amount of transmitting light of HeNe laser beam for the above fiber-type device was inspected. The result is as shown in FIG. 13. As shown in FIG. 13, the amount of the transmitting light for the device did not lower even if 500 hours passed.

Further, the time change of the amount of the transmitting light of HeNe laser beam for the device obtained in comparative example 1 was inspected. The result is as shown in FIG. 13. As shown in FIG. 13, in this fiber-type device, the amount of transmitting light lowered as the time passed.

Also, it is known that the lowering rate of the amount of the transmitting light becomes large as the humidity in the ambient gas is increased.

While the present invention has been described in connection with what is presently considered to be the most practical and preferred embodiment, it is to be understood that the invention is not to be limited to the disclosed embodiment, but is intended to cover various modifications and equivalent arrangement included within the spirit and scope of the appended claims.

We claim:

1. A fiber-type wavelength converting device, comprising;
   an organic nonlinear optical crystal core; and
   a glass cladding surrounding said core;
   wherein the exit end face of said core has fine asperites and the exit end face of said cladding is flat; and
   wherein the exit end face of said core is formed inside with respect to the exit end face of said cladding.

2. A fiber-type device as claimed in claim 1, wherein particles formed by grinding are left proximate the fine asperities.

3. A fiber-type device as claimed in claim 1, wherein the cladding has a minimum outer diameter of 1 mm.

4. A fiberoptic harmonic generating device comprising;
   a nonlinear optical crystal core; and
   a cylindrical cladding surrounding said core that produces a second harmonic output by Cherenkov radiation, said cladding having an outer diameter of at least 1 mm;
   wherein said device has an input face and an output face, said output face being ground and polished so that fine asperities are formed on the output face in a region of said core.

5. A fiber-type device as claimed in claim 4, wherein particles formed by grinding and polishing are left proximate the fine asperities.

6. A fiber-type wavelength converting device, comprising;
   a nonlinear optical crystal core; and
   a glass cladding surrounding said core;
   wherein the exit end face of said cladding is flat, the exit end face of said core is formed inside with respect to said exit end face of said cladding, said exit end face of said core has asperities, and particles are filled in a recess portion composed of a bottom surface of said exit end face of said core and side surface of an inner wall of said cladding.

7. A fiber-type device as claimed in claim 6, further comprising a thin film formed on an input end face of said device.

8. A fiber-type device as claimed in claim 6, wherein the cladding has an outer diameter of at least 1 mm.

* * * * *